(12) United States Patent
Chang et al.

(10) Patent No.: US 7,597,816 B2
(45) Date of Patent: Oct. 6, 2009

(54) WAFER BEVEL POLYMER REMOVAL

(75) Inventors: Jeremy Chang, Sunnyvale, CA (US); Andreas Fischer, Castro Valley, CA (US); Peter Loewenhardt, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 558 days.

(21) Appl. No.: 10/934,081

(22) Filed: Sep. 3, 2004

(65) Prior Publication Data

US 2006/0051967 A1 Mar. 9, 2006

(51) Int. Cl.
*H01L 21/302* (2006.01)

(52) U.S. Cl. .............................. 216/67; 216/49; 216/79; 438/710; 438/725; 438/906; 134/1.2; 134/902

(58) Field of Classification Search .................. 438/706, 438/710, 712, 719; 216/67
See application file for complete search history.

(56) References Cited

U.S. PATENT DOCUMENTS

| | | | |
|---|---|---|---|
| 4,624,728 A * | 11/1986 | Bithell et al. ........... 156/345.47 |
| 4,962,049 A | 10/1990 | Chang et al. | |
| 5,213,650 A | 5/1993 | Wang et al. | |
| 5,356,478 A | 10/1994 | Chen et al. | |
| 5,385,624 A * | 1/1995 | Amemiya et al. ...... 156/345.24 |
| 5,647,953 A | 7/1997 | Williams et al. | |
| 5,679,215 A | 10/1997 | Barnes et al. | |
| 5,707,485 A * | 1/1998 | Rolfson et al. .............. 438/716 |
| 5,911,833 A | 6/1999 | Denison et al. | |
| 6,095,158 A | 8/2000 | Shugrue | |
| 6,174,370 B1 * | 1/2001 | Yoshida ....................... 118/500 |
| 6,235,640 B1 * | 5/2001 | Ebel et al. .................... 438/706 |
| 6,325,948 B1 | 12/2001 | Chen et al. | |
| 6,491,042 B1 * | 12/2002 | Young et al. .................. 134/1.1 |
| 6,626,185 B2 | 9/2003 | Demos et al. | |
| 6,659,111 B1 * | 12/2003 | Mouri et al. ................ 134/22.1 |
| 6,852,636 B1 | 2/2005 | O'Donnell | |
| 6,991,739 B2 * | 1/2006 | Kawaguchi et al. ........... 216/67 |
| 7,276,447 B1 * | 10/2007 | Delgadino et al. .......... 438/694 |
| 7,468,326 B2 * | 12/2008 | Chen et al. ................... 438/758 |
| 2003/0116535 A1 * | 6/2003 | Tsai et al. ...................... 216/83 |
| 2003/0134231 A1 * | 7/2003 | Tsai et al. .................... 430/312 |
| 2006/0137711 A1 * | 6/2006 | Liao ............................ 134/1.2 |
| 2007/0272270 A1 * | 11/2007 | Liao ............................ 134/1.3 |
| 2008/0050923 A1 * | 2/2008 | Kim et al. .................... 438/706 |
| 2008/0067145 A1 * | 3/2008 | Wang et al. .................... 216/57 |
| 2008/0179010 A1 * | 7/2008 | Bailey, III et al. ...... 156/345.43 |
| 2008/0182412 A1 * | 7/2008 | Bailey, III et al. ............ 438/689 |
| 2008/0216864 A1 * | 9/2008 | Sexton et al. ................ 134/1.2 |
| 2008/0227301 A1 * | 9/2008 | Fang et al. ................... 438/706 |
| 2009/0084758 A1 * | 4/2009 | Chen et al. .................... 216/67 |
| 2009/0114244 A1 * | 5/2009 | Sexton et al. ................ 134/1.1 |

* cited by examiner

*Primary Examiner*—Anita K Alanko
(74) *Attorney, Agent, or Firm*—Beyer Law Group LLP

(57) ABSTRACT

A method of forming a semiconductor device is provided. A wafer with a dielectric layer disposed under a photoresist mask is placed in an etch chamber. The dielectric layer is etched. The wafer is raised. A cleaning gas is provided. A plasma is formed from the cleaning gas. A polymer that has formed on the bevel of the wafer is removed using the plasma from the cleaning gas. The wafer is removed from the etch chamber.

20 Claims, 5 Drawing Sheets

WAFER BEVEL POLYMER REMOVAL

BACKGROUND OF THE INVENTION

The present invention relates to the fabrication of semiconductor-based devices. More particularly, the present invention relates to improved techniques for fabricating semiconductor-based devices with an etched dielectric layer.

During semiconductor wafer processing, features of the semiconductor device are defined in the wafer using well-known patterning and etching processes. In these processes, a photoresist (PR) material is deposited over a dielectric layer on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the dielectric layer is etched to remove the underlying dielectric material from the areas that are no longer protected by the photoresist material, and thereby define the desired features in the dielectric layer.

SUMMARY OF THE INVENTION

To achieve the foregoing and other objects and in accordance with the purpose of the present invention a method of for forming a semiconductor device is provided. A wafer with a dielectric layer disposed under a photoresist mask is placed in an etch chamber. The dielectric layer is etched. The wafer is raised. A cleaning gas is provided. A plasma is formed from the cleaning gas. A polymer that has formed on the bevel of the wafer is removed using the plasma from the cleaning gas. The wafer is removed from the etch chamber.

In another manifestation of the invention, an apparatus for processing semiconductor devices formed on a wafer is provided. An etch chamber is provided. A gas source is in fluid connection with the etch chamber. A plasma energy source is coupled to the etch chamber. A wafer support is placed within the etch chamber. Ceramic lifting pins for raising the wafer above the wafer support are located within the etch chamber.

In another manifestation of the invention, an apparatus for raising wafers in an etcher, which comprises an etch chamber, a gas source, a plasma energy source for energizing gas from the gas source, a wafer support, and an actuator is provided. The apparatus for raising the wafers comprises a plurality of ceramic pins mechanically connected to the actuator, so that the actuator is able to raise and lower the ceramic pins.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
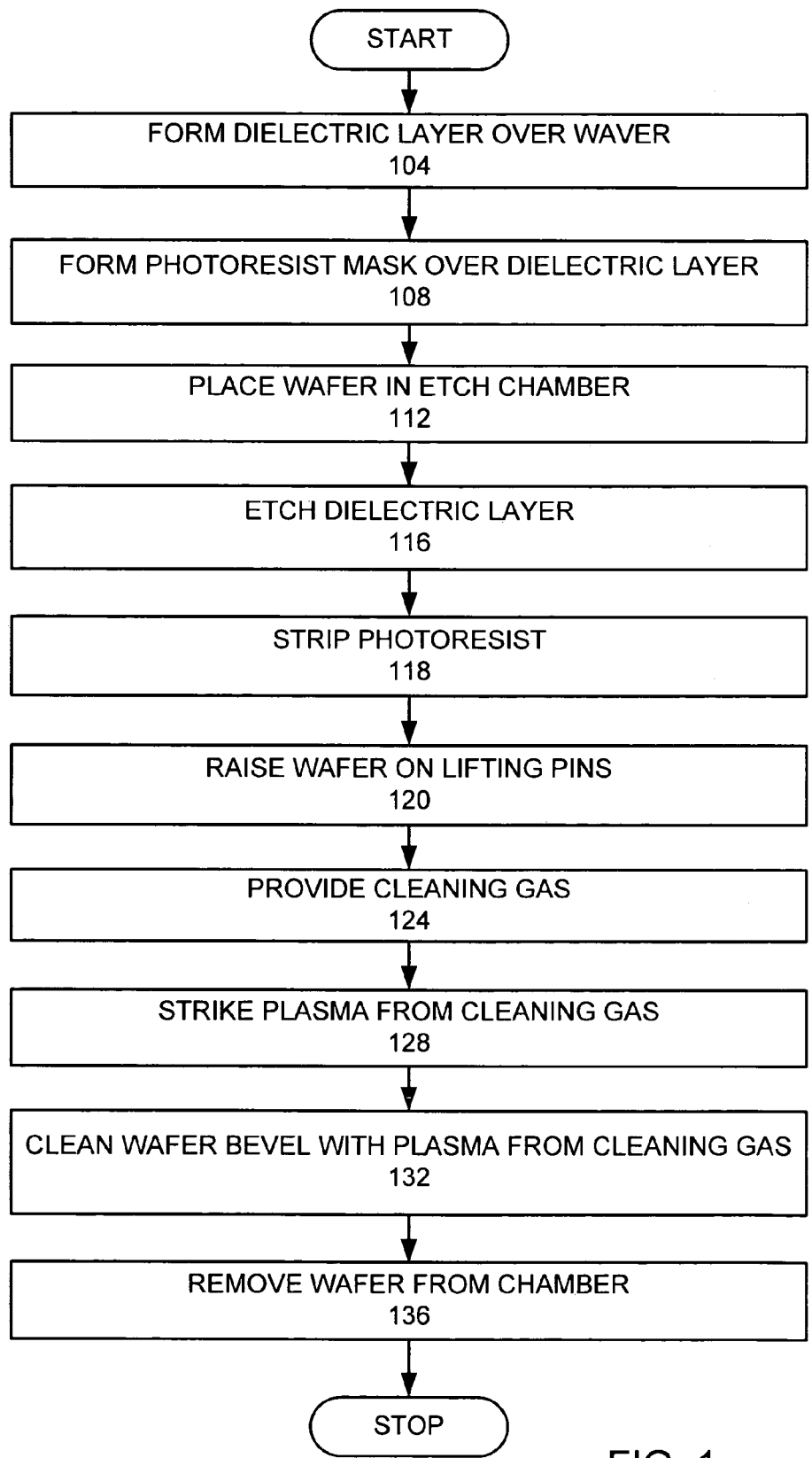
FIG. 1 is a flow chart of a process used in an embodiment of the invention.
Figure 2A:
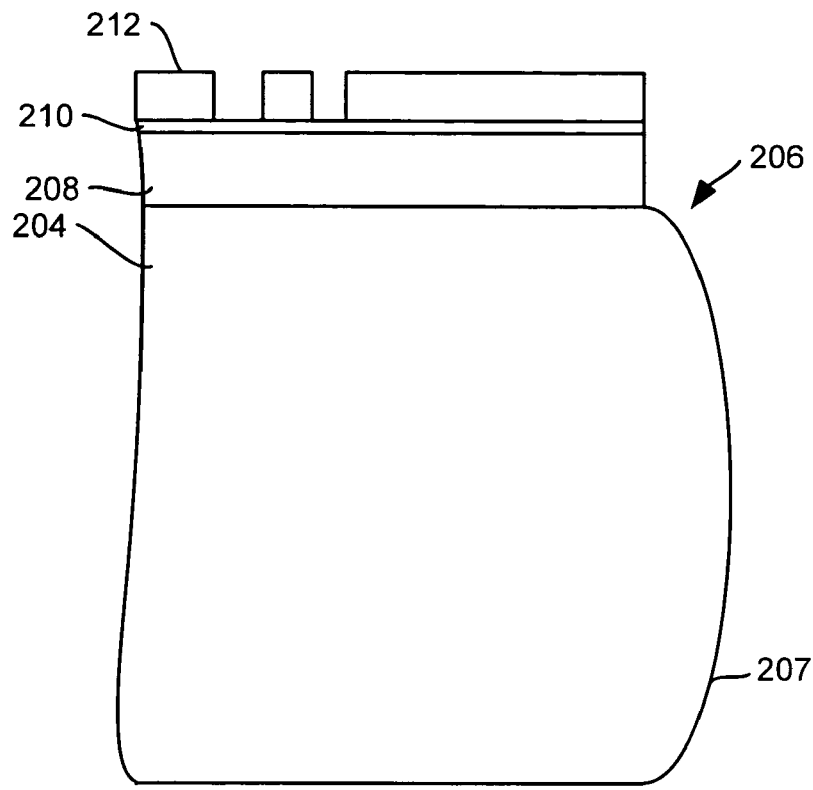
FIGS. 2A-D are schematic side views of a wafer processed according to the process of FIG. 1.

To facilitate understanding, FIG. 1 is a high level flow chart of a process used in an embodiment of the invention. A dielectric layer is formed over a wafer (step 104). FIG. 2A is a cross-sectional view of a wafer 204 at an outer edge 206 of the wafer 204. The outer edge 206 is curved forming a bevel 207. A dielectric layer 208 is formed over the wafer 204 (step 104). A photoresist mask 212 is formed over the dielectric layer 208 (step 108). In this embodiment, an antireflective coating (ARC) 210, such as BARC, is placed over the dielectric layer 208 before the photoresist mask 212 is formed, so that the ARC 210 is between the dielectric layer 208 and the photoresist mask 212. Other layers may be disposed between the dielectric layer 208 and the photoresist mask 212.

Figure 3:
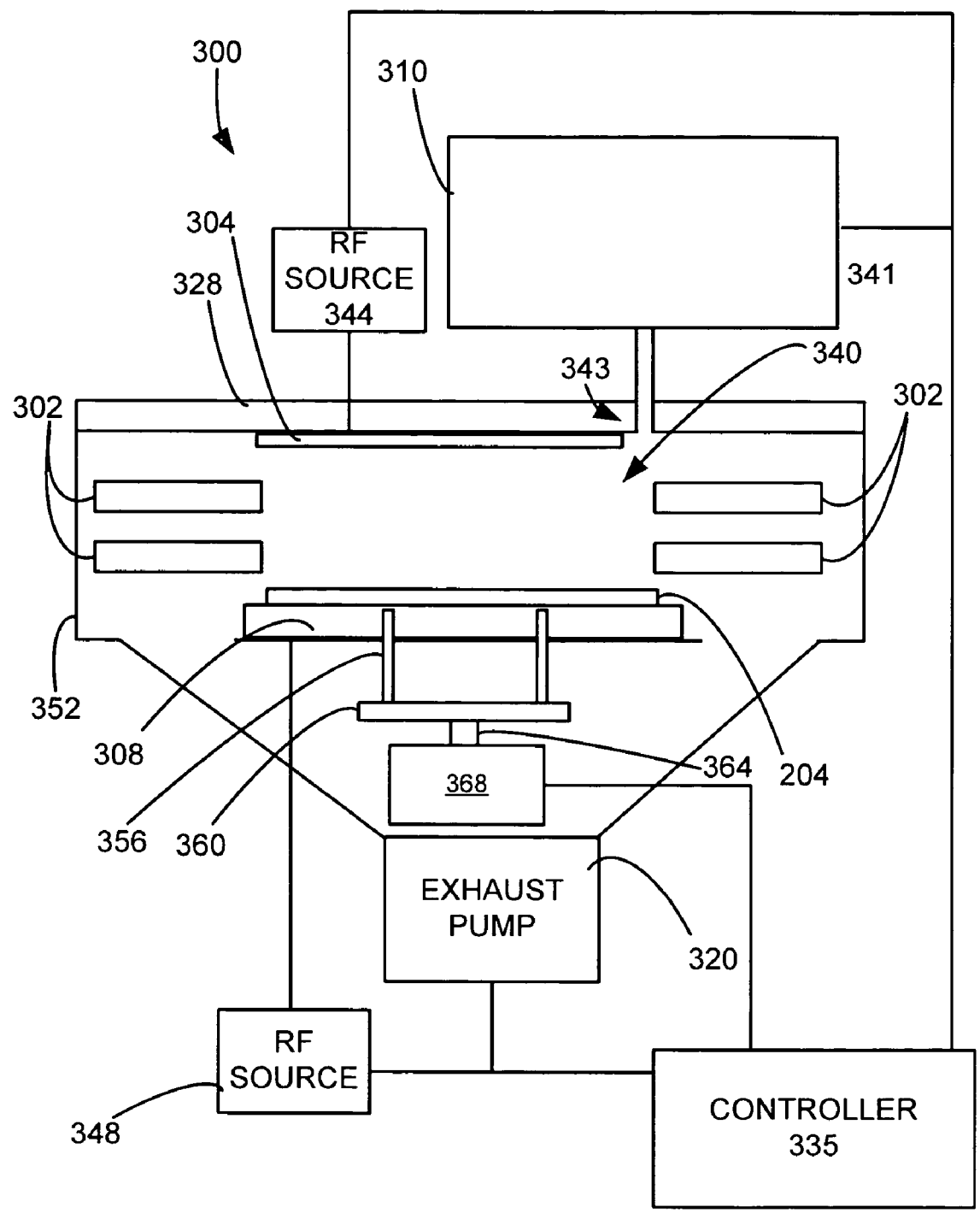
FIG. 3 is a schematic view of a process chamber that may be used in an embodiment of the invention.

The wafer 204 is placed in an etch chamber (step 112). FIG. 3 is a schematic view of a plasma processing chamber 300 that may be used for etching, stripping, and cleaning that may be used in this embodiment of the invention. The plasma processing chamber 300 comprises confinement rings 302, an upper electrode 304, a lower electrode 308, a gas source 310, and an exhaust pump 320. Within plasma processing chamber 300, the wafer 204 is positioned upon the lower electrode 308. The lower electrode 308 incorporates a suitable substrate chucking mechanism (e.g., electrostatic, mechanical clamping, or the like) for holding the wafer 204, so that the lower electrode 308 is also a chuck and a wafer support. The reactor top 328 incorporates the upper electrode 304 disposed immediately opposite the lower electrode 308. The upper electrode 304, lower electrode 308, and confinement rings 302 define the confined plasma volume. Gas is supplied to the confined plasma volume by the gas source 310 and is exhausted from the confined plasma volume through the confinement rings 302 and an exhaust port by the exhaust pump 320. A first RF source 344 is electrically connected to the upper electrode 304. A second RF source 348 is electrically connected to the lower electrode 308. Chamber walls 352 surround the confinement rings 302, the upper electrode 304, and the lower electrode 308. Lifting pins 356 are mounted on a lifting pin base 360, mounted on a shaft 364, powered by an actuator 368. The actuator 368 is controllably connected to the controller 335. Both the first RF source 344 and the second RF source 348 may comprise a 27 MHz power source and a 2 MHz power source. Different combinations of connecting RF power to the electrode are possible. In the case of a 2300 Flex™ or a Exelan HPT or a 2300™ Exelan, made by LAM Research Corporation™ of Fremont, Calif., which may be used in a preferred embodiment of the invention, both the 27 MHz and 2 MHz power sources make up the second RF power source 348 connected to the lower electrode, and the upper electrode is grounded. A controller 335 is controllably connected to the RF sources 344, 348, exhaust pump 320, the actuator 368, and the gas source 310. These devices have been modified so that the lifting pins 356 are not electrically conductive (are electrical insulators). In addition, the lifting pins are etch resistant. The actuator raises the pins, which pass through the wafer support, to cause the pins to contact the wafer, when the wafer is raised off of the wafer support 308.

Figure 4A:
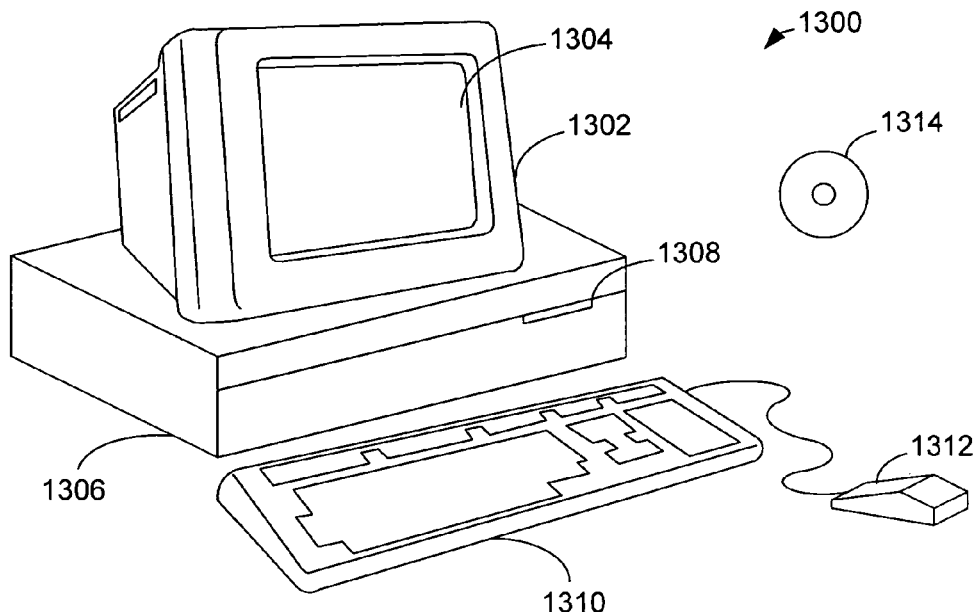
FIGS. 4A-B are schematic views of a computer system that may be used as a controller.
Figure 4B:
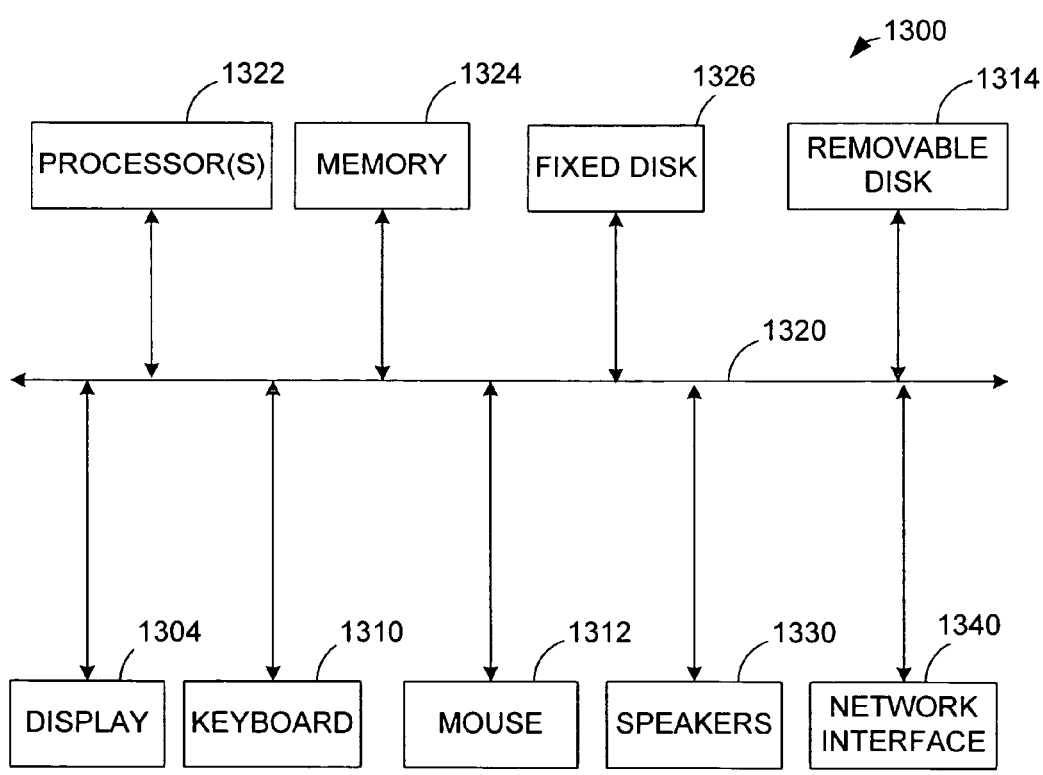

FIGS. 4A and 4B illustrate a computer system 1300, which is suitable for implementing a controller 335 used in embodiments of the present invention. FIG. 4A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 4B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312 and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: flash memory cards, magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
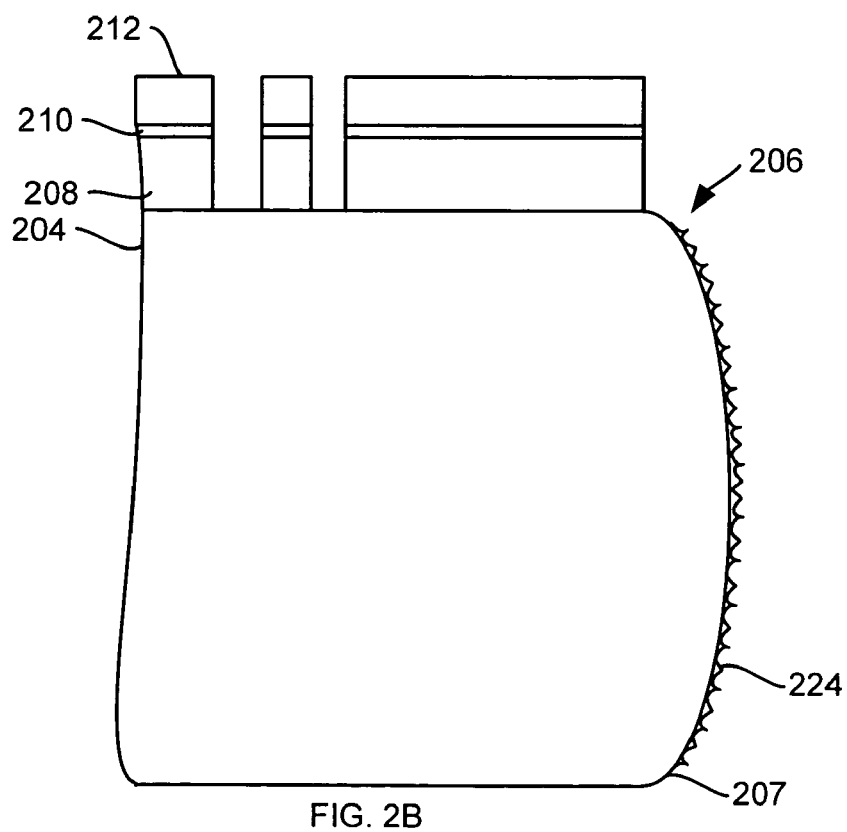
Figure 2C:
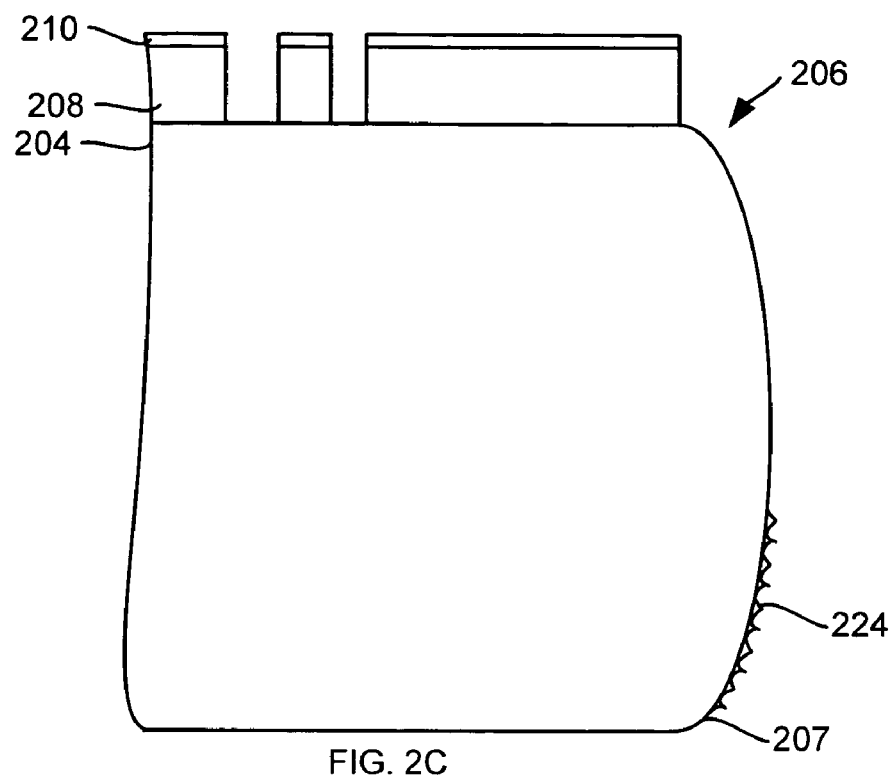

The dielectric layer 208 is etched (step 116). As shown in FIG. 2B, the dielectric etch causes a polymer 224 to form on the bevel 207 of the wafer 204. The photoresist mask 212 is then stripped from the wafer (step 118), as shown in FIG. 2C. Preferably, the stripping is performed in situ, within the etch chamber. In addition to removing the photoresist mask, the stripping process removes some of the polymer 224 on the bevel 207. However, some the polymer 224 is not removed from the bevel 207. It is believed that the polymer 207 on the bottom part of the bevel is more likely to remain than polymer on top of the bevel 207, as shown, due to stripping geometries. Namely, that the stripping is more effective on the side of the wafer exposed to the plasma source and that plasma does not as effectively reach the parts of the wafer facing away from the plasma source. Preferably, the stripping plasma is then quenched, although other embodiments of the invention may provide a continuous plasma through the cleaning step, instead of quenching the plasma and reigniting the plasma.

After the stripping plasma is quenched, the actuator 368 causes the wafer shaft 364 and wafer base 360 to raise the wafer pins 356, which raises the wafer 204 off of the wafer support 308 (step 120). A cleaning gas is then provided into the etch chamber (step 124). A plasma is struck from the cleaning gas (step 128).

The wafer has a front side, which is the side of the wafer over which the photoresist mask is formed. Within the chamber, it is preferable that the front side of the wafer faces the top of the chamber and away from the wafer support. The wafer has a back side, opposite the front side. Within the chamber, the back side of the wafer preferably faces the wafer support.

Figure 2D:
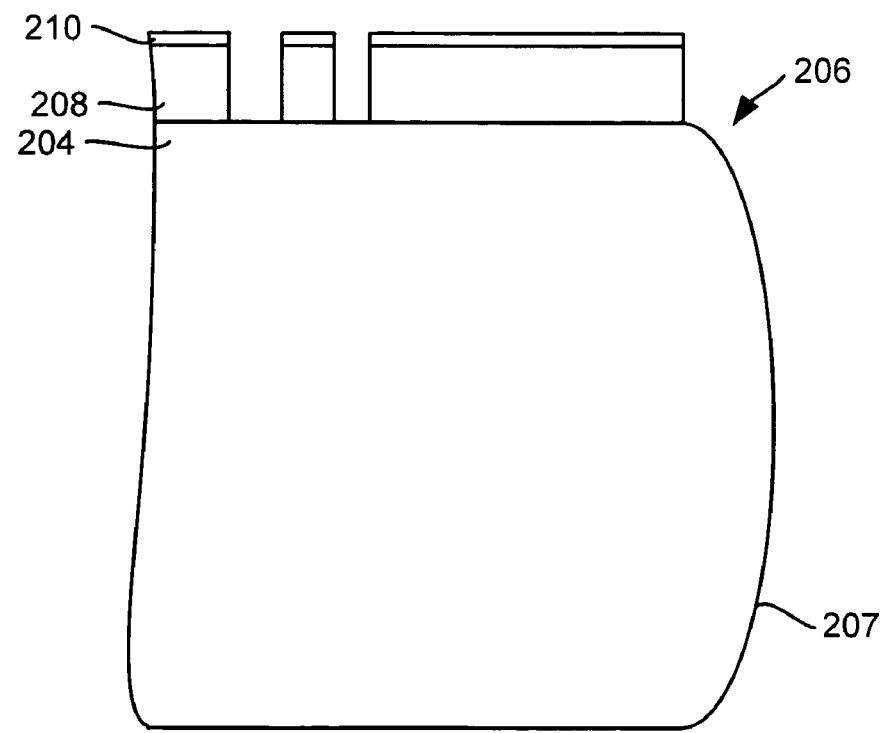

It is preferable that the wafer is raised enough so that some plasma is generated between the wafer 204 and the wafer support 308 on the back side of the wafer. It is also preferable that the wafer is not raised too high. This allows a plasma to also be generated between the wafer 204 and the top of the chamber on the front side of the wafer. The plasma from the cleaning gas is then used to clean the wafer bevel (step 132), as shown in FIG. 2D.

The wafer is then removed from the chamber (step 136). Preferably, this is accomplished by raising the wafer further up to a point where it is then removed from the chamber. In other embodiments, plasma is lit at the pin height where wafer can be readily removed from the chamber, so that the bevel cleaning is done when the wafer is lifted by the pins to the height where removal takes place. As a result, after the bevel cleaning is performed, the wafer is removed without additional lifting of the pins.

EXAMPLE

In one example of the invention, a dielectric layer is formed over a wafer. In this example, the dielectric layer is a low k (k<3.0) or porous dielectric, such as Coral (step 104). A photoresist mask is formed over the dielectric layer (step 108). In this example, an ARC layer of BARC is formed before the photoresist mask. The photoresist mask is made of 193 nm resist. The wafer is then placed in an etch chamber (step 112). In this example, the etch chamber is an Exelan 2300. This chamber is able to provide etching, stripping, and the inventive cleaning in situ. This chamber has three lifting pins.

The dielectric layer is etched (step 116). An example of a dielectric etch recipe is an etch gas comprising Ar, CxHyFz, $N_2$, and $O_2$ is provided. Generally, the etch step used in this invention is an etch that requires more polymer in the etch process gas. Such polymer in the process gas may be used to maintain desired etch profiles. The polymer also causes polymer deposition on the wafer bevel. The photoresist is then stripped (step 118). An example of a strip recipe uses a stripping gas of $O_2$ and $N_2$. The stripping plasma is quenched.

The actuator causes the wafer shaft and wafer base 360 to raise the wafer pins, which raise the wafer off of the wafer support 308 (step 120). In this example, the wafer is lifted from the wafer support a distance of 10 mm. A cleaning gas is provided into the etch chamber. In this example, the cleaning gas is 2,000 sccm $O_2$. The chamber pressure is maintained at between about 100 mTorr to 600 mTorr. A plasma is struck from the cleaning gas (step 128). In this example, 100 watts at 27 MHz and 0 watts at 2 MHz are provided to generate and maintain a plasma from the cleaning gas. It has been found that using this recipe provided complete cleaning in about 30 seconds. It is preferred and believed that with optimization cleaning can be accomplished in less than 15 seconds.

In one embodiment of the invention, the cleaning gas consists essentially of oxygen. It is preferred that cleaning gas comprises at least an oxygen containing gas. It is believed that gas chemistries use for polymer photoresist stripping may be used for the cleaning gas.

It is preferred that the power supplied by the higher frequency source be between 30 and 1000 watts. It is more preferable that the power supplied by the higher frequency source be between 50 and 500 watts. It is most preferable that the power supplied by the higher frequency source be between 100 and 300 watts.

It is preferred that the power supplied by the lower frequency source (the bias power) be between 0 and 500 watts. It is more preferable that the power supplied by the lower frequency source be between 0 and 300 watts. It is most preferable that the power supplied by the lower frequency source be between 0 and 100 watts. The power from the lower frequency source is kept low to minimize bias during the cleaning process.

It is preferred that the wafer is raised a distance greater than 2 mm above the wafer support. It is more preferred that the wafer is raised a distance of 3 to 20 mm above the wafer support. It is most preferred that the wafer is raised a distance of 4 to 10 mm above the wafer support.

It is preferred that the plasma for cleaning is applied for less than 40 seconds. It is more preferred that the plasma for cleaning is applied for less than 30 seconds. It is most preferred that the plasma for cleaning is applied for less than 15 seconds.

It is preferred that the lifting pins have resistance an order of magnitude higher than the real part of plasma resistance. In the preferred embodiment, the lifting pins have a resistance greater than 100 ohms. It is more preferable that the pins are electrical insulators. It is preferred that the pins are etch resistant. In these examples, the pins were ceramic. The high resistance of the pins prevent wafer damage during the cleaning process, when the wafer is raised on the pins.

In other embodiments, the strip step may be eliminated or may occur after the bevel cleaning.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications and various substitute equivalents as fall within the true spirit and scope of the present invention.

What is claimed is:

1. A method for forming a semiconductor device, comprising:
    placing a wafer with a dielectric layer disposed under a photoresist mask in an etch chamber;
    etching the dielectric layer, thereby forming polymer on the bevel of the wafer;
    providing a stripping gas;
    forming a plasma from the stripping gas;
    stripping the photoresist mask using the plasma from the stripping gas;
    quenching the plasma from the stripping gas;
    raising the wafer;
    providing a cleaning gas after quenching the plasma and raising the wafer;
    forming a plasma from the cleaning gas;
    removing the polymer that has formed on the bevel of the wafer using the plasma from the cleaning gas on the raised wafer; and
    removing the wafer from the etch chamber, wherein the etching of the dielectric layer takes place within the etch chamber and wherein the removing of the polymer takes place within the etch chamber.

2. The method, as recited in claim 1, further comprising stripping the photoresist mask in situ before raising the wafer.

3. The method, as recited in claim 2, wherein the wafer has a back side and a front side, wherein the forming a plasma from the cleaning gas generates plasma adjacent to both the back side and front side of the wafer.

4. The method, as recited in claim 3, wherein the raising the wafer uses lifting pins to raise the wafer.

5. The method, as recited in claim 4, wherein the lifting pins have an electrical resistance greater than 100 ohms.

6. The method, as recited in claim 5, wherein the raising the wafer raises the wafer 3 to 20 mm above a wafer support.

7. The method, as recited in claim 6, wherein the lifting pins are resistant to etching.

8. The method, as recited in claim 7, wherein a bias power is less than 300 watts is supplied during the removing polymer that has formed on the bevel.

9. The method, as recited in claim 8, wherein the cleaning gas is at least 5% oxygen.

10. The method, as recited in claim 8, wherein the cleaning gas consist essentially of oxygen.

11. The method, as recited in claim 1, wherein the wafer has a back side and a front side, wherein the forming the plasma from the cleaning gas generates plasma adjacent to both the back side and front side of the wafer.

12. The method, as recited in claim 1, wherein the raising the wafer uses lifting pins to raise the wafer.

13. The method, as recited in claim 12, wherein the lifting pins have an electrical resistance greater than 100 ohms.

14. The method, as recited in claim 12, wherein the lifting pins are resistant to etching.

15. The method, as recited in claim 1, wherein the raising the wafer raises the wafer 3 to 20 mm above a wafer support.

16. The method, as recited in claim 1, wherein a bias power is less than 300 watts is supplied during the removing polymer that has formed on the bevel.

17. The method, as recited in claim 1, wherein the cleaning gas is at least 5% oxygen.

18. The method, as recited in claim 1, wherein the cleaning gas consists essentially of oxygen.

19. The method, as recited in claim 1, wherein the raising operation is performed after the quenching operation.

20. The method, as recited in claim 1, wherein:
the raising of the wafer includes raising the wafer to a removal height;
the removing of the polymer is performed at least partly while the wafer is at the removal height; and
the removing of the wafer from the etch chamber is performed such that the wafer exits the etch chamber substantially at the removal height.

* * * * *

UNITED STATES PATENT AND TRADEMARK OFFICE
CERTIFICATE OF CORRECTION

PATENT NO.        : 7,597,816 B2
APPLICATION NO.   : 10/934081
DATED             : October 6, 2009
INVENTOR(S)       : Chang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 742 days.

Signed and Sealed this

Twenty-eighth Day of September, 2010

David J. Kappos
*Director of the United States Patent and Trademark Office*